United States Patent
Lee et al.

(10) Patent No.: US 11,355,600 B2
(45) Date of Patent: *Jun. 7, 2022

(54) HIGH ELECTRON MOBILITY TRANSISTORS HAVING IMPROVED DRAIN CURRENT DRIFT AND/OR LEAKAGE CURRENT PERFORMANCE

(71) Applicant: Cree, Inc., Durham, NC (US)

(72) Inventors: Kyoung-Keun Lee, Cary, NC (US); Fabian Radulescu, Chapel Hill, NC (US); Scott Sheppard, Chapel Hill, NC (US)

(73) Assignee: Wolfspeed, Inc., Durham, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/148,688

(22) Filed: Jan. 14, 2021

(65) Prior Publication Data

US 2021/0134966 A1    May 6, 2021

Related U.S. Application Data

(63) Continuation of application No. 16/238,853, filed on Jan. 3, 2019, now Pat. No. 10,937,873.

(51) Int. Cl.
*H01L 29/40* (2006.01)
*H01L 21/02* (2006.01)
(Continued)

(52) U.S. Cl.
CPC ........ *H01L 29/408* (2013.01); *H01L 21/0217* (2013.01); *H01L 21/0254* (2013.01);
(Continued)

(58) Field of Classification Search
CPC . H01L 29/408; H01L 29/2003; H01L 29/205; H01L 29/7787; H01L 29/66462;
(Continued)

(56) References Cited

U.S. PATENT DOCUMENTS 7,045,404 B2    5/2006    Sheppard et al.
7,901,994 B2    3/2011    Saxler et al.
(Continued)

FOREIGN PATENT DOCUMENTS

WO    2012111363 A1    8/2012

OTHER PUBLICATIONS

"Notification of Transmittal of the International Search Report and the Written Opinion of the International Searching Authority, or the Declaration, corresponding to International Application No. PCT/US2019/068557, dated Jun. 26, 2020, 18 pages".

*Primary Examiner* — Sitaramarao S Yechuri
(74) *Attorney, Agent, or Firm* — Myers Bigel, P.A.

(57) ABSTRACT

A high electron mobility transistor includes a channel layer, a barrier layer on the channel layer, source and drain contacts on the barrier layer, a gate contact between the source and drain contacts, and a multi-layer passivation structure on the upper surface of the barrier layer between the source contact and the drain contact. The multi-layer passivation structure includes a first passivation layer that comprises a charge dissipation material directly contacts the upper surface of the barrier layer and a second passivation layer comprising a different material than the first passivation layer that also directly contacts the upper surface of the barrier layer. In some embodiments, at least one recess may be formed in the upper surface of the barrier layer and the second passivation layer may be formed within the recesses.

20 Claims, 9 Drawing Sheets

(51) Int. Cl.
*H01L 21/306* (2006.01)
*H01L 29/20* (2006.01)
*H01L 29/205* (2006.01)
*H01L 29/66* (2006.01)
*H01L 29/778* (2006.01)

(52) U.S. Cl.
CPC .. *H01L 21/02178* (2013.01); *H01L 21/02266* (2013.01); *H01L 21/02378* (2013.01); *H01L 21/02458* (2013.01); *H01L 21/30612* (2013.01); *H01L 29/2003* (2013.01); *H01L 29/205* (2013.01); *H01L 29/66462* (2013.01); *H01L 29/7787* (2013.01)

(58) Field of Classification Search
CPC ........... H01L 21/0217; H01L 21/02378; H01L 21/0254; H01L 21/30612; H01L 21/02266; H01L 21/02458; H01L 21/02178
See application file for complete search history.

(56) References Cited

U.S. PATENT DOCUMENTS

| | | |
|---|---|---|
| 2007/0018199 A1 | 1/2007 | Sheppard et al. |
| 2011/0212582 A1 | 9/2011 | Hong et al. |
| 2011/0272743 A1 | 11/2011 | Hwang et al. |
| 2012/0043591 A1 | 2/2012 | Takada |
| 2012/0156836 A1* | 6/2012 | Shealy .............. H01L 29/66462 438/172 |
| 2013/0102140 A1* | 4/2013 | Derluyn .............. H01L 29/4236 438/586 |
| 2013/0153963 A1* | 6/2013 | Shealy .............. H01L 29/66431 257/190 |
| 2013/0161698 A1 | 6/2013 | Marino et al. |
| 2016/0005823 A1 | 1/2016 | Yao et al. |
| 2016/0293746 A1 | 10/2016 | Murase |
| 2017/0170089 A1 | 6/2017 | Donkers et al. |
| 2017/0170295 A1* | 6/2017 | Yu ....................... H01L 29/0843 |
| 2017/0263742 A1 | 9/2017 | Endoh |
| 2017/0365701 A1 | 12/2017 | Kim et al. |
| 2018/0033631 A1* | 2/2018 | Bera ................. H01L 29/66462 |
| 2018/0358456 A1 | 12/2018 | Iucolano et al. |

* cited by examiner

HIGH ELECTRON MOBILITY TRANSISTORS HAVING IMPROVED DRAIN CURRENT DRIFT AND/OR LEAKAGE CURRENT PERFORMANCE

CROSS-REFERENCE TO RELATED APPLICATIONS

This application is a continuation of, and claims priority under 35 U.S.C. § 120 to, U.S. patent application Ser. No. 16/238,853, filed Jan. 3, 2019. The disclosure of which is incorporated herein by reference.

FIELD

The inventive concepts described herein relate to semiconductor devices and, more particularly, to high electron mobility transistors.

BACKGROUND

Electronic devices formed in lower bandgap semiconductor materials such as silicon and gallium arsenide have found wide application in lower power and (in the case of silicon) lower frequency applications. These semiconductor materials may be less well suited for higher power and/or high frequency applications, however, because of their relatively small bandgaps (e.g., 1.12 eV for silicon and 1.42 eV for gallium arsenide at room temperature) and/or relatively small breakdown voltages.

For high power, high temperature and/or high frequency applications, devices formed in wide bandgap semiconductor materials such as silicon carbide (2.996 eV bandgap for alpha silicon carbide at room temperature) and the Group III nitrides (e.g., 3.36 eV bandgap for gallium nitride at room temperature) are often used. These materials, typically, have higher electric field breakdown strengths and higher electron saturation velocities as compared to gallium arsenide and silicon.

A device of particular interest for high power and/or high frequency applications is the High Electron Mobility Transistor (HEMT). HEMT devices may offer operational advantages under a number of circumstances because a two-dimensional electron gas (2DEG) is formed at the heterojunction of two semiconductor materials with different bandgap energies, where the smaller bandgap material has a higher electron affinity. The 2DEG is an accumulation layer in the smaller bandgap material and can contain a very high sheet electron concentration. Additionally, electrons that originate in the wider-bandgap semiconductor transfer to the 2DEG layer, allowing a high electron mobility due to reduced ionized impurity scattering. This combination of high carrier concentration and high carrier mobility can give the HEMT a very large transconductance and may provide a strong performance advantage over metal oxide semiconductor field effect transistors (MOSFETs) for high-frequency applications.

High electron mobility transistors fabricated in Group III-nitride based material systems have the potential to generate large amounts of radio frequency (RF) power because of the combination of material characteristics that includes the aforementioned high breakdown fields, wide bandgaps, large conduction band offset, and/or high saturated electron drift velocity. As used herein, the term "Group III-nitride" refers to those semiconducting compounds formed between nitrogen (N) and the elements in Group III of the periodic table, usually aluminum (Al), gallium (Ga), and/or indium (In). The term also refers to ternary and quaternary (or higher) compounds such as, for example, AlGaN and AlInGaN. As is well understood by those in this art, the Group III elements can combine with nitrogen to form binary (e.g., GaN), ternary (e.g., AlGaN, AlInN), and quaternary (e.g., AlInGaN) compounds. These compounds all have empirical formulas in which one mole of nitrogen is combined with a total of one mole of the Group III elements.

FIG. 1A is a schematic plan view of a conventional gallium nitride based high electron mobility transistor 100, while FIG. 1B is a schematic cross-sectional view of the high electron mobility transistor 100 taken along line 1B-1B of FIG. 1A. As shown in FIGS. 1A-1B, the high electron mobility transistor 100 may be formed on a substrate 110 such as, for example, a silicon carbide substrate. An optional buffer layer 120 may be formed on the substrate 110, and a channel layer 130 is formed on the buffer layer 120 opposite the substrate 110. A barrier layer 140 is formed on the channel layer 130 opposite the substrate 110. The channel layer 130 and the barrier layer 140 may include Group III-nitride based materials, where the channel layer 130 has a bandgap that is less than a bandgap of the barrier layer 140. The substrate 110, buffer layer 120, channel layer 130 and barrier layer 140 may together form a semiconductor structure 102. A source contact 150 and a drain contact 152 are formed on an upper surface of the barrier layer 140 and are laterally spaced apart from each other. A gate contact 154 is formed on the upper surface of the barrier layer 140 between the source contact 150 and the drain contact 152. A passivation layer 160 covers the exposed portions of the top surface of the barrier layer 140. A 2DEG layer 132 is formed at a junction between the channel layer 130 and the barrier layer 140 when the HEMT device 100 is biased to be in its conducting or "on" state. The 2DEG layer 132 acts as a highly conductive layer that allows current to flow between the source and drain regions of the device that are beneath the source contact 150 the drain contact 152, respectively.

SUMMARY

Pursuant to some embodiments of the present invention, high electron mobility transistors are provided that include a channel layer, a barrier layer on the channel layer, the barrier layer having a lower surface that is adjacent the channel layer and an upper surface that is opposite the lower surface, a source contact on the upper surface of the barrier layer, a drain contact on the upper surface of the barrier layer, a gate contact on the upper surface of the barrier layer between the source contact and the drain contact, and a passivation layer on the upper surface of the barrier layer between the source contact and the drain contact. A first recess is provided in the upper surface of the barrier layer, and the passivation layer is within the first recess.

In some embodiments, the passivation layer may comprise a second passivation layer, and the transistor further includes a first passivation layer on the upper surface of the barrier layer between the source contact and the drain contact, where both the first passivation layer and the second passivation layer directly contact the barrier layer. In such embodiments, the first passivation layer may be a first material and the second passivation layer may be a second material that is different than the first material. For example, the first material may be a first silicon nitride material having a first ratio of silicon to nitrogen and the second material may be a second silicon nitride material having a second ratio of silicon to nitrogen, where the first ratio of silicon to nitrogen is at least ten percentage points greater than the second ratio of silicon to nitrogen. In other example embodiments, the first material may be alumina and the second material may be silicon nitride. In some embodiments, the first material may be a charge dissipation material.

In some embodiments, the first recess may be underneath the gate contact, and the second passivation layer may be within the first recess. In other embodiments, the first recess may be adjacent one of the source contact or the drain contact. In some embodiments, the transistor of may include the recess and a second recess in the upper surface of the barrier layer, where the second passivation layer is within both the first recess and the second recess. The first recess may be, for example, adjacent the source contact and the second recess may be adjacent the drain contact. In some embodiments, the transistor may further include a third recess in the upper surface of the barrier layer, where the second passivation layer is within the third recess and the third recess is underneath the gate contact.

In some embodiments, the second passivation layer may cover the first passivation layer.

In some embodiments, the first passivation layer may directly contact a first percentage of the portion of the upper surface of the barrier layer that is between the source contact and the gate contact and may directly contact a second percentage of the portion of the upper surface of the barrier layer that is between the gate contact and the drain contact, where the first percentage is different from the second percentage by at least 10 percentage points. For example, in one specific embodiment, the second percentage may be greater than the first percentage by at least 20 percentage points.

In some embodiments, the second passivation layer may directly contact a third percentage of the portion of the upper surface of the barrier layer that is between the source contact and the gate contact and may directly contact a fourth percentage of the portion of the upper surface of the barrier layer that is between the gate contact and the drain contact, where the third percentage is different from the fourth percentage by at least 10 percentage points. For example, in one specific embodiment, the third percentage may exceed the fourth percentage by at least 50 percentage points.

Pursuant to further embodiments of the present invention, high electron mobility transistors are provided that include a channel layer, a barrier layer on the channel layer, the barrier layer having a lower surface that is adjacent the channel layer and an upper surface that is opposite the lower surface, a source contact on the upper surface of the barrier layer, a drain contact on the upper surface of the barrier layer, a gate contact on the upper surface of the barrier layer between the source contact and the drain contact, and a first passivation layer on the upper surface of the barrier layer between the source contact and the drain contact. The first passivation layer directly contacts a first percentage of the portion of the upper surface of the barrier layer that is between the source contact and the gate contact and directly contacts a second percentage of the portion of the upper surface of the barrier layer that is between the gate contact and the drain contact, wherein the second percentage is different from the first percentage.

In some embodiments, the second percentage may exceed the first percentage by at least 10 percentage points. In other embodiments, the second percentage may exceed the first percentage by at least 30 percentage points.

In some embodiments, the transistor may further include a second passivation layer that directly contacts the upper surface of the barrier layer between the source contact and the drain contact, where the second passivation layer comprises a different material than the first passivation layer. The first passivation layer may be a charge dissipation material. For example, the first passivation layer may be a silicon-rich silicon nitride or alumina.

In some embodiments, the second passivation layer may directly contact a third percentage of the portion of the upper surface of the barrier layer that is between the source contact and the gate contact and may directly contact a fourth percentage of the portion of the upper surface of the barrier layer that is between the gate contact and the drain contact, where the fourth percentage is different from the third percentage. For example, the third percentage may exceed the fourth percentage by at least 30 percentage points.

In some embodiments, the first passivation layer may be a charge dissipation material.

In some embodiments, the barrier layer may include at least one recess in the upper surface thereof, and where the second passivation layer may be deposited within the at least one recess. In an example embodiment, the at least one recess may include a recess that is underneath the gate contact.

Pursuant to still further embodiments of the present invention, high electron mobility transistors are provided that include a channel layer, a barrier layer on the channel layer, the barrier layer having a lower surface that is adjacent the channel layer and an upper surface that is opposite the lower surface, a source contact on the upper surface of the barrier layer, a drain contact on the upper surface of the barrier layer, a gate contact on the upper surface of the barrier layer between the source contact and the drain contact, a first passivation layer that directly contacts the upper surface of the barrier layer between the source contact and the drain contact, the first passivation layer comprising a charge dissipation material, and a second passivation layer that directly contacts the upper surface of the barrier layer between the source contact and the drain contact, the second passivation layer comprising a different material than the first passivation layer.

In some embodiments, the second passivation layer may also be on an upper surface of the first passivation layer.

In some embodiments, the second passivation layer may not be a charge dissipation material.

In some embodiments, the charge dissipation material may be silicon-rich silicon nitride or alumina.

In some embodiments, a first recess may be provided in the upper surface of the barrier layer, and the second passivation layer may be within the first recess. The first recess may be, for example, underneath the gate contact or adjacent one of the source contact or the drain contact. In some embodiments, the transistor may further include a second recess in the upper surface of the barrier layer, where the second passivation layer is within the second recess, the first recess is adjacent the source contact and the second recess is adjacent the drain contact. The transistor may also include a third recess in the upper surface of the barrier layer, where the second passivation layer is within the third recess and the third recess is underneath the gate contact. The second passivation layer may cover the first passivation layer.

In some embodiments, the first passivation layer may directly contact a first percentage of the portion of the upper surface of the barrier layer that is between the source contact and the gate contact and may directly contact a second percentage of the portion of the upper surface of the barrier layer that is between the gate contact and the drain contact, where the second percentage exceeds the first percentage by at least 10 percentage points.

DETAILED DESCRIPTION

Embodiments of the present invention are directed to high electron mobility transistors that may exhibit improved drain current drift and/or leakage current performance.

Figure 1A:
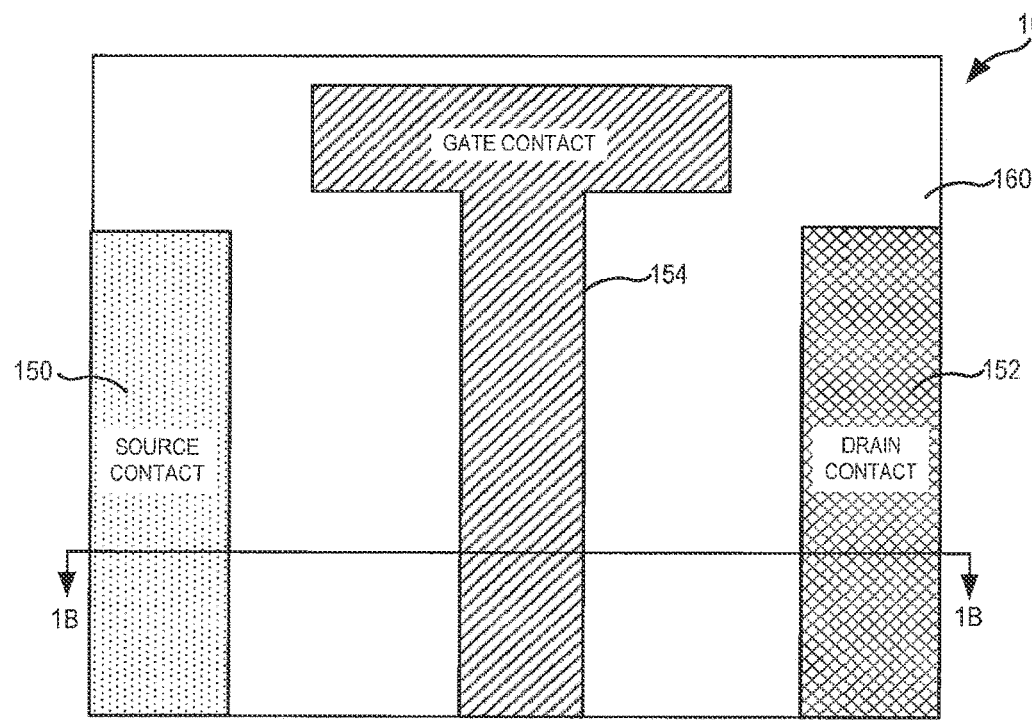
FIG. 1A is a schematic plan view of a conventional high electron mobility transistor.
Figure 1B:
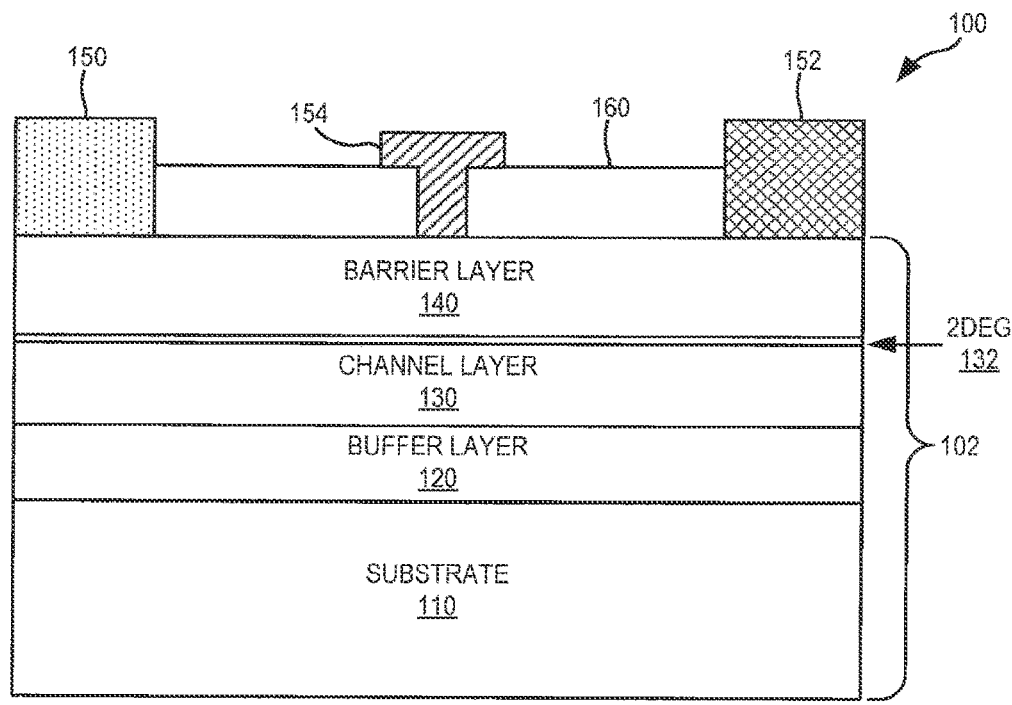
FIG. 1B is a schematic cross-sectional view taken along line 1B-1B of FIG. 1A.
Figure 2:
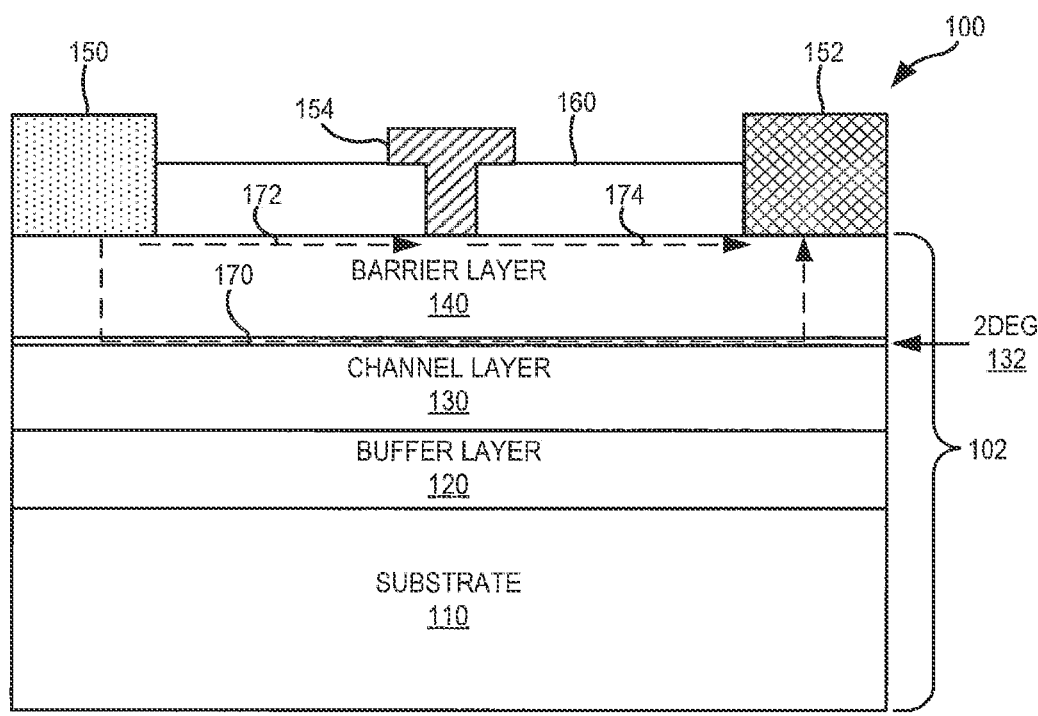
FIG. 2 is the cross-sectional view of FIG. 1B with various current paths identified thereon.

FIG. 2 is the cross-sectional view of FIG. 1B with various current paths illustrated thereon. As shown in FIG. 2, the primary on-state conduction path in a high electron mobility transistor is the conduction path 170 that is formed in the 2DEG layer 132 that allows a drain-to-source current $I_{DS}$ to flow between the source contact 150 and the drain contact 152. However, as is also shown in FIG. 2, additional current paths may exist in the conventional high electron mobility transistor 100. These additional current paths include a current path 172 between the source contact 150 and the gate contact 154 along the interface between the semiconductor structure 102 and the passivation layer 160 and a current path 174 between the gate contact 154 and the drain contact 152 along the interface between the semiconductor structure 102 and the passivation layer 160. The current paths 172 and 174 impact the gate leakage current $I_G$ and the drain leakage current $I_D$ of the device. The additional current paths 172, 174 that are illustrated in FIG. 2 are generally undesirable current paths.

The high electron mobility transistor 100 may be configured as a normally-on HEMT or as a normally-off HEMT. A normally-off HEMT is configured so that when the source and drain contacts 150, 152 are appropriately biased and no bias voltage is applied to the gate contact 154, the device will not conduct current between the drain and source contacts 150, 152. In contrast, a normally-on HEMT is configured so that when the drain and source contacts 150, 152 are appropriately biased and no bias voltage is applied to the gate contact 154, the device will conduct current between the source and drain contacts 150, 152. Thus, in other words, a normally-off HEMT may be turned on (i.e., made conducting) by applying a bias voltage to the gate contact 154, while a normally-on HEMT may be turned off (i.e., made non-conducting) by applying a bias voltage to the gate contact 154. The discussion below will assume that the HEMT 100 is a normally-on HEMT, although embodiments of the present invention are not limited thereto Unfortunately, charges may build up in the semiconductor structure 102 due to, for example, defects in the upper surface of the semiconductor structure that act as electron traps. This charge build-up may result in the accumulation of charge in the semiconductor structure 202 that can reduce current flow when the HEMT 100 switches from the off-state to the on-state, which is referred to as RF dispersion. This behavior, in turn, may generate non-linearities when the HEMT device 100 is used as a transistor amplifier, and these non-linearities may give rise to passive intermodulation (PIM) distortion. As is known in the art, PIM distortion refers to the generation of unwanted intermodulation products along the transmit path of a communications system that may severely degrade the performance of the receive path of the communications system. The drain current drift performance of a high electron mobility transistor is a measure of the degree to which the drain current varies due to, for example, charge build-up, when the HEMT operates under steady state conditions.

Pursuant to embodiments of the present invention, high electron mobility transistors are provided that may have improved drain current drift performance and/or improved gate and drain leakage current performance. The high electron mobility transistors may be gallium nitride based devices or other Group III-nitride based devices. Without intending to be bound by any particular theory of operation, it is believed that defects along or near the upper surface of the semiconductor structure 102 (defects in such locations are referred to herein as defects "at" the upper surface of the semiconductor structure) may form electron traps that capture charges during operation of the HEMT device. These trapped charges may collect at the interface between the passivation layer 160 and the barrier layer 140 in the regions between the source contact 150 and the gate contact 154 and between the gate contact 154 and the drain contact 152, and these trapped charges may reduce current flow through the 2DEG layer 132. The HEMT devices according to embodiments of the present invention may include features that dissipate charges that are caught in the above-described electron traps. As a result, the drain current drift performance of the HEMT devices according to embodiments of the present invention may exhibit significantly improved drain current drift performance, and hence may exhibit improved PIM distortion performance.

The charges in the electron traps may be dissipated through the use of multi-layer passivation structures that are formed on the upper surface of the semiconductor structure between the source and drain contacts in the HEMT devices according to embodiments of the present invention. These multi-layer passivation structures may include a first passivation layer that is formed directly on portions of the upper surface of the semiconductor structure. The first passivation layer may be formed of a charge dissipation material that dissipates charges present in an underlying semiconductor layer. It has been found, however, that forming a single layer passivation structure using a charge dissipation material may undesirably increase either or both the gate leakage current $I_G$ and/or the drain leakage current $I_D$. Accordingly, the passivation structures according to embodiments of the present invention may further include a second passivation layer that is formed directly on other portions of the upper surface of the semiconductor structure. The second passivation layer is not formed of a charge dissipation material. The second passivation layer may reduce or prevent the above-described increase in the gate leakage current $I_G$ and/or the drain leakage current $I_D$.

In some embodiments, openings may be formed in the upper surface of the semiconductor structure in the region between the source and drain contacts, and the second passivation layer may be formed in these openings. These openings may further help in reducing any increase in the gate leakage current $I_G$ and/or the drain leakage current $I_D$. In some embodiments, one or more openings may be provided in the upper surface of the semiconductor structure between the source contact and the gate contact, and one or more additional openings may be provided in the upper surface of the semiconductor structure between the gate contact and the drain contact. In other embodiments, an opening may additionally or alternatively be provided in the upper surface of the semiconductor structure underneath the gate contact.

The charge dissipation material used to form the first passivation layer may comprise, for example, a silicon-rich silicon nitride layer or an alumina layer in example embodiments. Other dielectric materials having charge dissipation properties or metal-rich or Group IV-rich dielectric materials may also be used in other embodiments. Moreover, the multi-layer passivation structure need not be symmetrical. For example, in some embodiments, the first passivation layer may directly contact a first percentage of the upper surface of the portion of the semiconductor structure that is between the source contact and the gate contact, and may directly contact a second percentage of the upper surface of the portion of the barrier layer that is between the gate contact and the drain contact, where the first percentage is different from the second percentage. Thus, the shape and/or size of the multi-layer passivation structure on either side of the gate contact may be asymmetrical.

Embodiments of the present invention will now be described in greater detail with reference to the figures.

Figure 3A:
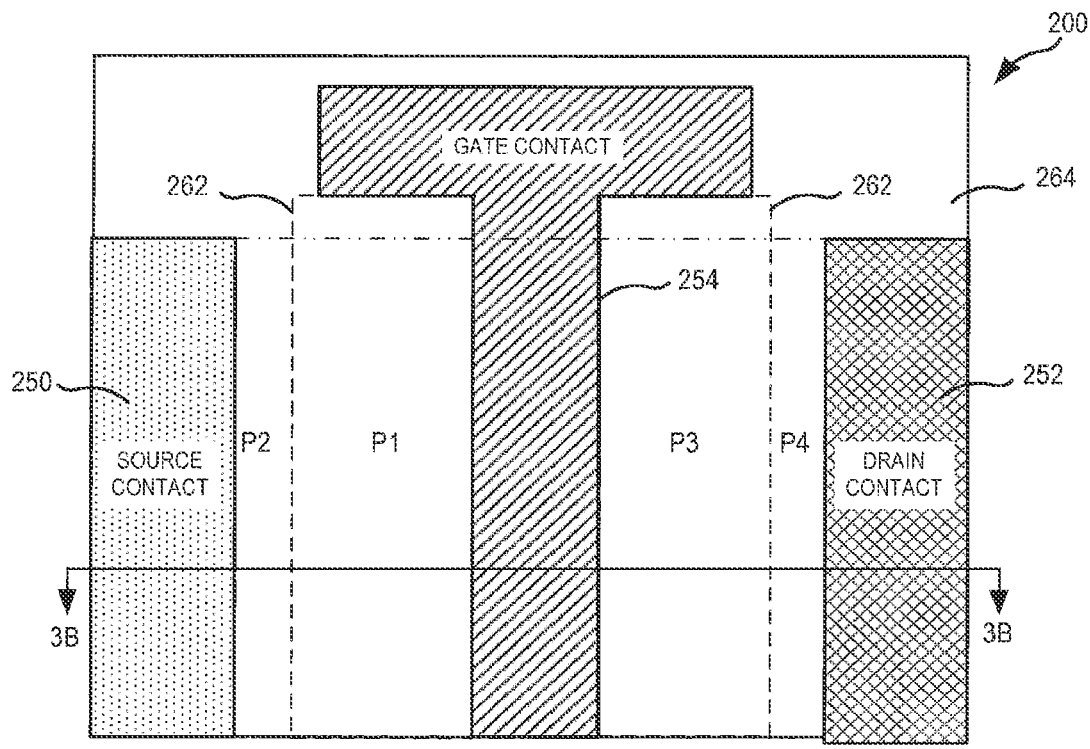
FIG. 3A is a schematic plan view of a high electron mobility transistor according to embodiments of the present invention.
Figure 3B:
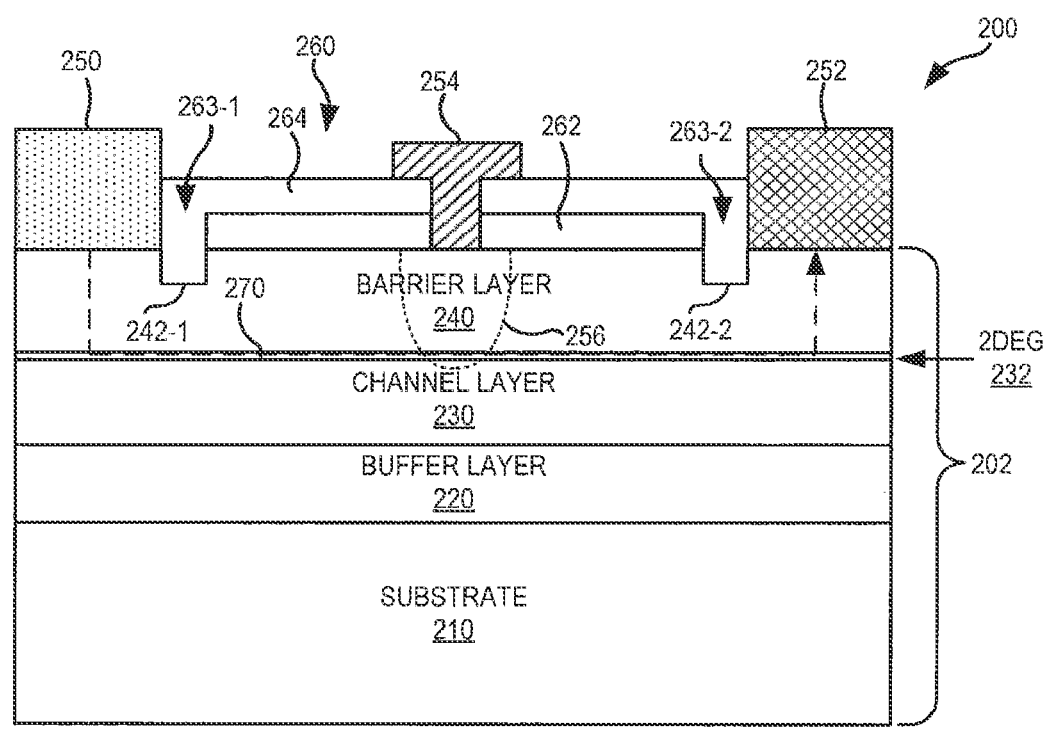
FIG. 3B is a schematic cross-sectional view taken along line 3B-3B of FIG. 3A.
Figure 3C:
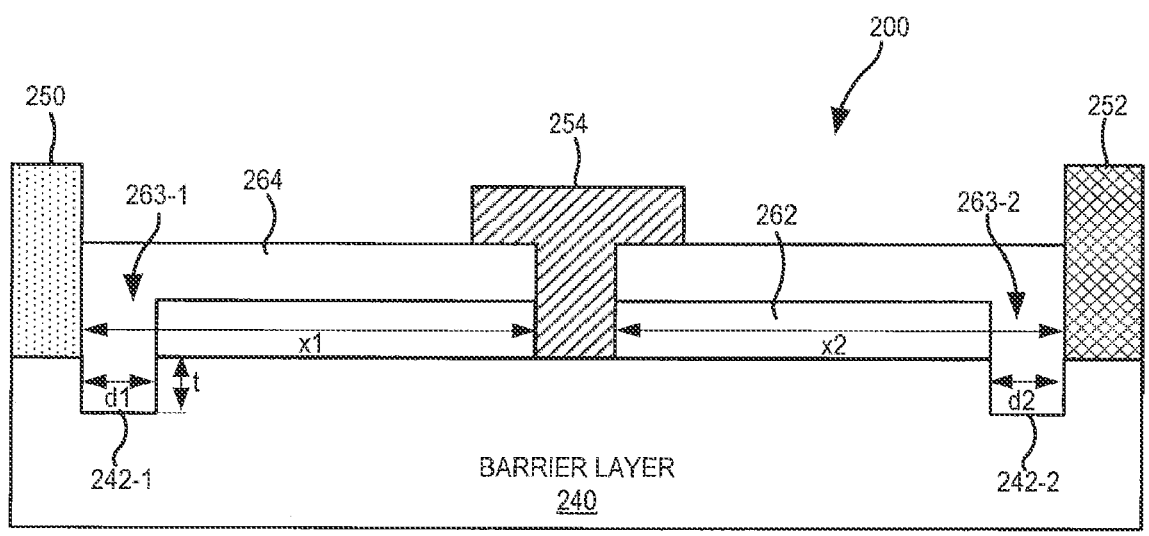
FIG. 3C is an enlarged view of a portion of FIG. 3B.

FIG. 3A is a schematic plan view of a gallium nitride based high electron mobility transistor 200 according to embodiments of the present invention, and FIG. 3B is a schematic cross-sectional view of the high electron mobility transistor 200 taken along line 3B-3B of FIG. 3A. FIG. 3C is an enlarged view of a portion of FIG. 3B. As shown in FIGS. 3A-3B, the high electron mobility transistor 200 may be formed on a substrate 210. The substrate 210 may comprise, for example, a semi-insulating silicon carbide substrate that may be, for example, a 4H polytype or a 6H polytype of silicon carbide. Other silicon carbide candidate polytypes that may be used to form the substrate 210 include the 3C, 6H, and 15R polytypes. The term "semi-insulating" is used descriptively rather than in an absolute sense. In particular embodiments of the present invention, the silicon carbide bulk crystal has a resistivity equal to or higher than about $1 \times 10^5$ Ω-cm at room temperature. Although silicon carbide may be used as a substrate material, embodiments of the present invention may utilize any suitable substrate, such as sapphire, aluminum nitride, aluminum gallium nitride, gallium nitride, silicon, GaAs, LGO, ZnO, LAO, InP and the like. The substrate 210 may be a silicon carbide wafer, and the high electron mobility transistor 200 may be formed, at least in part, via wafer-level processing, and the wafer may then be diced to provide a plurality of individual high electron mobility transistors 200.

One or more optional layers 220 such as, for example, buffer, nucleation and/or transition layers, may be formed on an upper surface of the substrate 210. For example, an AlN buffer layer 220 may be formed on the upper surface of the substrate 210 to provide an appropriate crystal structure transition between the silicon carbide substrate 210 and the remainder of the device 200. Additionally, strain balancing transition layer(s) 220 may also and/or alternatively be provided as described, for example, in commonly assigned U.S. Patent Publication No. 2003/0102482 A1, the disclosure of which is incorporated herein by reference as if set forth fully herein. The optional buffer/nucleation/transition layers 220 may be deposited by metal organic chemical vapor deposition (MOCVD) or by other techniques known to those of skill in the art, such as molecular beam epitaxy (MBE) or high vapor pressure epitaxy (HVPE).

A channel layer 230 is formed on the upper surface of the substrate 210 (or on the optional layers 220), and a barrier layer 240 is formed on an upper surface of the channel layer 230. The channel layer 230 may have a bandgap that is less than the bandgap of the barrier layer 240 and the channel layer 230 may also have a larger electron affinity than the barrier layer 240. The channel layer 230 and the barrier layer 240 may include Group III-nitride based materials.

In some embodiments, the channel layer 230 may be a Group III nitride, such as $Al_xGa_{1-x}N$, where 0≤x<1, provided that the energy of the conduction band edge of the channel layer 230 is less than the energy of the conduction band edge of the barrier layer 240 at the interface between the channel and barrier layers 230, 240. In certain embodiments of the present invention, x=0, indicating that the channel layer 230 is GaN. The channel layer 230 may also be other Group III-nitrides such as InGaN, AlInGaN or the like. The channel layer 230 may be undoped ("unintentionally doped") and may be grown to a thickness of greater than about 20 Å. The channel layer 230 may also be a multi-layer structure, such as a superlattice or combinations of GaN, AlGaN or the like. The channel layer 230 may be under compressive strain in some embodiments.

In some embodiments, the barrier layer 240 is AlN, AlInN, AlGaN or AlInGaN or combinations of layers thereof. The barrier layer 240 may comprise a single layer or may be a multi-layer structure. In particular embodiments of the present invention, the barrier layer 240 may be thick enough and may have a high enough aluminum (Al) composition and doping to induce a significant carrier concentration at the interface between the channel layer 230 and the barrier layer 240 through polarization effects when the barrier layer 240 is buried under ohmic contact metal. The barrier layer 240 may, for example, be from about 0.1 nm to about 30 nm thick, but is not so thick as to cause cracking or substantial defect formation therein. Barrier layer thicknesses in the range of 15-30 nm are common. In certain embodiments, the barrier layer 240 is undoped or doped with an n-type dopant to a concentration less than about $10^{19}$ $cm^{-3}$. In some embodiments of the present invention, the barrier layer 240 is $Al_xGa_{1-x}N$ where 0<x<1. In particular embodiments, the aluminum concentration is about 25%. However, in other embodiments of the present invention, the barrier layer 240 comprises AlGaN with an aluminum concentration of between about 5% and about 100%. In specific embodiments of the present invention, the aluminum concentration is greater than about 10%. The channel layer 230 and/or the barrier layer 240 may be deposited, for example, by MOCVD, MBE or HVPE. As discussed above with respect to the conventional HEMT 100, a 2DEG layer 232 is induced in the channel layer 230 at a junction between the channel layer 230 and the barrier layer 240. The 2DEG layer 232 acts as a highly conductive layer that allows conduction between the source and drain regions of the device that are beneath the source contact 250 the drain contact 252, respectively. The substrate 210, the buffer/nucleation/transition layer(s) 220, the channel layer 230 and the barrier layer 240 form a semiconductor structure 202.

A source contact 250 and a drain contact 252 are formed on an upper surface of the barrier layer 240 and are laterally spaced apart from each other. A gate contact 254 is formed on the upper surface of the barrier layer 240 between the source contact 250 and the drain contact 252. The material of the gate contact 254 may be chosen based on the composition of the barrier layer 240. Conventional materials capable of making a Schottky contact to a gallium nitride based semiconductor material may be used, such as, for example, Ni, Pt, NiSi$_x$, Cu, Pd, Cr, W and/or WSiN. The source contact 250 and the drain contact 252 may include a metal, such as TiAlN, that can form an ohmic contact to a gallium nitride based semiconductor material.

As discussed above, the high electron mobility transistors according to embodiments of the present invention may have a multi-layer passivation structure 260 that is formed on the upper surface of the barrier layer 240. In an example embodiment, the multi-layer passivation structure 260 may include a first passivation layer 262 and a second passivation layer 264, both of which directly contact the upper surface of the semiconductor structure 202 (e.g., contact the upper surface of the barrier layer 240). It will also be appreciated that more than two passivation layers may be included in the multi-layer passivation structure 260 in some embodiments. The multi-layer passivation structure 260 will be discussed in further detail below.

As discussed above, high electron mobility transistors may be configured as normally-on HEMTs or as normally-off HEMTs. The discussion below will assume that the HEMT 200 is a normally-on HEMT, although embodiments of the present invention are not limited thereto.

As shown by the arrow labelled 270 in FIG. 3B, when no bias voltage is applied to the gate contact 254 (and the source and drain contacts 250, 252 have suitable bias voltages applied thereto), electrons will flow downward through the source contact 250 to the 2DEG layer 232, and then will flow laterally along the 2DEG layer 232 to the portion of the semiconductor layer structure 202 underneath the drain contact 252, and will then flow upwardly into the drain contact 252. When a sufficient bias voltage is applied to the gate contact 254, however, a region in the semiconductor material underneath the gate contact 254 will be depleted of charge carriers. The depletion region is shown in FIG. 3B as a region 256 that is defined by a dotted curve, with the size of the depletion region 256 being a function of, among other things, the applied gate bias voltage. The absence of charge carriers on the depletion region 256 effectively "blocks" electron flow through the 2DEG layer 232, and hence the application of the gate bias voltage turns off the HEMT 200.

However, as discussed above with reference to FIGS. 1A-1B, there are various current paths other than the current path 270 through the HEMT 200, including a gate leakage current $I_G$ path (see 172 in FIG. 1B) and a drain leakage current $I_D$ path (see 174 in FIG. 1B). The gate and drain leakage current paths may allow current flow even when the HEMT device 200 is biased to be in an off-state. Additionally, as described above, electron traps that are associated with, for example, defects at the upper surface of the barrier layer 240 may hold charges which may result in charge collecting at the interface of the barrier layer 240 and the channel layer 230 that may reduce or block current flow along the 2DEG layer 232 even when the gate contact 254 is unbiased (i.e., when the HEMT 200 is biased to be in the on-state). While these charges will dissipate over time, when the HEMT 200 is used, for example, as an RF amplifier, the gate bias voltage cycles at high speed between the on-state and the off-state, and the charges resulting from the electron traps may thus hold energy in the vicinity of the 2DEG layer 232. As the gate bias voltage is removed to switch the HEMT 200 into its on-state, the charge may have a "memory effect" that is referred to herein as "drain lag" that may at least partially block current flow through the 2DEG layer 232 after the gate bias voltage is removed. Drain lag results in non-linearities that may give rise to passive intermodulation distortion, which may seriously degrade the performance of a communications system that includes the HEMT 200.

Figure 4:
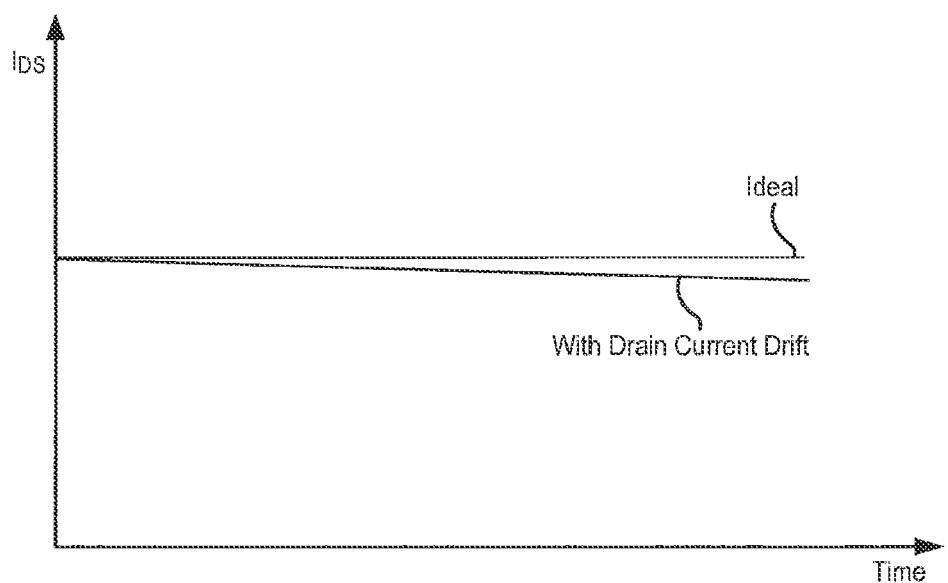
FIG. 4 is a graph illustrating how the source-to-drain current of a high electron mobility transistor may change over time during steady-state operating conditions due to drain current drift.

The drain current drift performance of a HEMT device is one characterization of the above-described drain lag effect. The drain current drift performance may be measured by applying direct current ("DC") bias voltages to the HEMT that bias the HEMT in its on-state and then seeing how the drain current $I_{DS}$ changes over time under such steady state operating conditions. This is shown graphically in FIG. 4. Theoretically, a steady state condition should be reached so that the drain current $I_{DS}$ will be constant, as shown by the curve labeled "Ideal" in FIG. 4. However, due to mechanisms such as the above-discussed charge build-up, a depletion region may form that may partially block the 2DEG channel, which may cause the drain current to decrease over time as shown by curve labelled "With Drain Current Drift" in FIG. 4.

As discussed above, pursuant to embodiments of the present invention, HEMT devices having multi-layer passivation structures 260 are provided that may exhibit significantly improved drain current drift performance. The multi-layer passivation structure 260 may be designed to modulate the electron traps in the upper surface of the semiconductor structure 202 in order to reduce the amount of charge that builds up in the electron traps. By modulating the electron traps in this manner, the drain current drift performance of the HEMT may be improved.

In some embodiments, the HEMT device 200 may include a passivation structure 260 that causes an interaction between the passivation structure and the electron traps so that less charge builds up in the semiconductor structure 202. For example, a passivation structure that includes non-stoichiometric silicon nitride that is silicon-rich may be used in some embodiments. In other embodiments, other passivation materials may be used such as, for example, metal-rich or Group IV-rich dielectric materials (i.e., materials including an element from Group IV of the Periodic Table of elements where the Group IV material, such as silicon) including silicon-rich $SiO_2$ and alumina. The silicon-rich silicon nitride, alumina or other passivation material may comprise a charge dissipation material that acts to dissipate charges that build up in the electron traps along the upper surface of the barrier layer 240. It has been found that both silicon-rich silicon nitride and alumina may act as charge dissipation materials. The charge dissipation material may counteract the charges in the electron traps, provide dissipation paths for the charges, or otherwise act to reduce the amount of charge that builds up in the barrier layer 240. As a result, less charge may be present in the semiconductor structure 202, and hence the amount of drain lag may be reduced.

It has been found, however, that forming the passivation structure using a charge dissipation material may increase either or both the gate leakage current $I_G$ and/or the drain leakage current $I_D$. Accordingly, a multi-layer passivation structure 260 may be used according to embodiments of the present invention that includes at least a first passivation layer that is formed of a charge dissipation material and a second passivation layer that acts to block the gate and drain leakage currents. Both the first and second passivation layers may be formed to directly contact the semiconductor structure 202 (e.g., the barrier layer 240).

Referring again to FIGS. 3A-3B, it can be seen that a multi-layer passivation structure 260 is formed on the semiconductor structure 202 at least in the region between the source and drain contacts 250, 252. The multi-layer passivation structure 260 includes both a first passivation layer 262 and a second passivation layer 264. The first passivation layer 262 may be formed of a charge dissipation material. Herein, a charge dissipation material refers to a material that substantially dissipates charges that are trapped at the upper surface of an underlying semiconductor layer. Suitable charge dissipation materials for forming the first passivation layer 262 include silicon-rich silicon nitride ($Si_xN_y$), silicon-rich silicon oxide ($SiO_2$) and alumina ($Al_2O_3$). The first passivation layer 262 directly contacts the upper surface of the barrier layer 240 on both sides of the gate contact 254. The first passivation layer 262 may be blanket deposited on the device. An etching step may be performed to form openings 263-1, 263-2 in the first passivation layer 262 adjacent the source contact 250 and the drain contact 252, respectively. The openings 263-1, 263-2 in the first passivation layer 262 expose selected portions of the upper surface of the semiconductor structure 202.

The second passivation layer 264 may be formed of a conventional material such as, for example, stoichiometric silicon nitride or nitrogen-rich silicon nitride. The second passivation layer 264 may not be formed of a charge dissipation material. The second passivation layer 264 may directly contact portions of the upper surface of the barrier layer 240 between the source and drain contacts 250, 252 that are not covered by the first passivation layer 262. The second passivation layer 264 may be blanket deposited on the device and hence may also cover the first passivation layer 262. In one example embodiment, the first passivation layer 262 may be formed of a first silicon nitride material that has a first ratio of silicon to nitrogen and the second passivation layer 264 may be formed of a second silicon nitride material that has a second ratio of silicon to nitrogen. The first silicon nitride material may be a silicon-rich silicon nitride and the second silicon nitride material may not be a silicon-rich silicon nitride. A first ratio of silicon to nitrogen in the first passivation layer 262 may be at least 5 percentage points greater than a second ratio of silicon to nitrogen in the second passivation layer 264 in some embodiments. In other embodiments, the ratio of silicon to nitrogen in the first passivation layer 262 may be at least 10 percentage points greater than the ratio of silicon to nitrogen in the second passivation layer 264. In still other embodiments, the ratio of silicon to nitrogen in the first passivation layer 262 may be at least 15 percentage points greater than the ratio of silicon to nitrogen in the second passivation layer 264.

As further shown in FIG. 3B, a pair of optional recesses 242-1, 242-2 may also be formed in the upper surface of the barrier layer 240. Recess 242-1 is adjacent the source contact 250 and recess 242-2 is adjacent the drain contact 252. The second passivation layer 264 may be formed in the recesses 242-1, 242-2, and may substantially fill each recess 242-1, 242-2. The recesses 242 may have a depth t. In an example embodiment, the depth t may be less than 25 nanometers (nm). In another example embodiment, the depth t may be between 0.5 and 15 nanometers (nm). In yet another example embodiment, the depth t may be between 1 and 10 nanometers (nm). In another example embodiment, the depth t may be between 2 and 8 nanometers (nm). In yet another example embodiment, the depth t may be between 3 and 7 nanometers (nm). In some embodiments, the recess 242-1 may have a lateral width of d1, while the recess 242-2 may have a lateral width of d2. The distances d1 and d2 and the depth t are shown in FIG. 3C, which is an enlarged view of a portion of the cross-section of FIG. 3B. The second passivation layer 264 directly contacts the upper surface of the barrier layer 240 over the lateral distance d1 in the region between the source contact 250 and the gate contact 254, and directly contacts the upper surface of the barrier layer 240 over the lateral distance d2 in the region between the gate contact 254 and the drain contact 252, as can be seen in FIGS. 3B-3C.

In some embodiments, the second passivation layer 264 may directly contact the underlying semiconductor structure 202 for a lateral distance d1 in the region between the source contact 250 and the gate contact 254, and may directly contact the underlying semiconductor structure 202 for a lateral distance d2 in the region between the gate contact 254 and the drain contact 252. In such embodiments, the etching step may remove a stripe of the first passivation layer 262 that has a width d1 adjacent the source contact 250 and may remove a stripe of the first passivation layer 262 that has a width d2 adjacent the drain contact 252 to expose portions of the barrier layer 240 having the corresponding lateral widths d1 and d2. The second passivation layer 264 may be formed on the exposed portions of the barrier layer 240 so that the second passivation layer 264 directly contacts a stripe of the barrier layer 240 having a width d1 adjacent the source contact 250 and directly contacts a stripe of the barrier layer 240 having a width d2 adjacent the drain contact 252.

The distance between the source contact 250 and the gate contact 254 along the upper surface of the barrier layer 240 may be a distance x1, and the distance between the drain contact 252 and the gate contact 254 along the upper surface of the barrier layer 240 may be a distance x2. These distances are also shown in the enlarged view of FIG. 3C. The distances x1 and x2 may each be, for example, in the range of 1-2 microns in example embodiments. It should also be noted that x1 need not be equal to x2. Sample devices were fabricated where the distances d1 and d2 were varied to determine the impact of these distances d1 and d2 (as a percentage of the distances x1 and x2, respectively) on drain current drift performance. Each of these samples had the design of the HEMT 200 of FIGS. 3A-3C. In these embodiments, the optional openings 242-1, 242-2 were omitted (i.e., t=0). TABLE 1 below shows the drain current drift performance for the four different sample designs as compared to a conventional HEMT having the design of FIGS. 1A-1B.

TABLE 1

| Sample | Structure | Drain Current Drift Variation (mA/mm) |
| --- | --- | --- |
| N/A | Conventional Device | 4.03 |
| 1 | HEMT 200 with d1~0; d2~0 | 1.05 |
| 2 | HEMT 200 with d1~0; d2 = 0.1* × 2 | 1.27 |
| 3 | HEMT 200 with d1~0; d2 = 0.5* × 2 | 0.93 |
| 4 | HEMT 200 with d1 = 0.1* × 1; d2 = 0.5* × 2 | 0.19 |

As can be seen from TABLE 1, all of the devices according to embodiments of the present invention exhibited significantly improved drain current drift performance as compared to a state-of-the-art conventional device. Moreover, the amount of improvement was a function of the distances d1 and d2 (i.e., the lateral widths of the openings 263-1, 263-2 in the first passivation layer 262), which, as discussed above, corresponds to the percentage of the distances x1 and x2, respectively, that the second passivation layer 264 directly contacts the barrier layer 240.

As shown in TABLE 1, in Sample 1 d1 and d2 were very small distances (e.g., less than 0.05*x1 and less than 0.05*x2, respectively) that result from etching so that only a small region of the second passivation layer 264 directly contacted the barrier layer 240 only in small regions adjacent the source contact 250 and the drain contact 252. As shown in TABLE 1, Sample 1 exhibited almost a 75% reduction in drain current drift as compared to the conventional state-of-the-art device.

In Samples 2 and 3, d1 again was a very small distance (e.g., less than 0.05*x1) so that only a small region of the second passivation layer 264 directly contacted the barrier layer 240 in the region between the source contact 250 and the gate contact 254. Distance d2, however, was made larger than distance d1, so that the second passivation layer 264 directly contacted a larger portion of the barrier layer 240 in the region between the gate contact 254 and the drain contact 252. In Sample 2, distance d2 was set to be equal to 10% of the distance x2 between the gate contact 254 and the drain contact 252. In Sample 3, distance d2 was set to be 50% of the distance x2 between the gate contact 254 and the drain contact 252. As shown in TABLE 1, the drain current drift performance for Samples 2 and 3 was again significantly better than the drain current drift performance of the conventional device, and somewhat comparable to the drain current drift performance of the device of Sample 1. The drain current drift performance of Sample 3 was improved as compared to Sample 2, indicating that widening opening 263-2 (i.e., increasing the lateral width d2) may improve performance.

In Sample 4, d1 was set as 10% of the distance x1 between the source contact 250 and the gate contact 254, and d2 was set as 50% of the distance x2 between the gate contact 254 and the drain contact 252. As shown in TABLE 1, the drain current drift performance was improved as compared to Samples 1-3, and was less than 5% the drain current drift exhibited by the conventional HEMT.

Thus, TABLE 1 shows that the passivation structures according to embodiments of the present invention may provide significantly improved drain current drift performance.

Samples 1 through 4 illustrate that the multi-layer passivation structure 260 need not be symmetric on opposed sides of the gate contact 254. In fact, the results in TABLE 1 show that improved performance may be achieved, at least in some cases, using asymmetric designs. Thus, it will be appreciated that the HEMT devices according to embodiments of the present invention may be designed so that the first passivation layer 262 directly contacts a first percentage of the upper surface of the portion of the barrier layer 240 that is between the source contact 250 and the gate contact 254 and the first passivation layer 262 directly contacts a second percentage of the upper surface of the portion of the barrier layer 240 that is between the gate contact 254 and the drain contact 252, where the second percentage is different from the first percentage. This is shown graphically in FIG. 3A, where the portion of the barrier layer 240 that is between the source contact 250 and the gate contact 254 is the combination of P1 and P2, and the portion of this region where the first passivation layer 262 directly contacts the upper surface of the portion of the barrier layer 240 is P1. Likewise, the portion of the barrier layer 240 that is between the gate contact 254 and the drain contact 252 is the combination of P3 and P4, and the portion of this region where the first passivation layer 262 directly contacts the upper surface of the barrier layer 240 is P3. FIG. 3A illustrates an embodiment of the present invention where P1 (which is the percentage of the upper surface of the portion of the barrier layer 240 that is between the source contact 250 and the gate contact 254 where the first passivation layer 262 directly contacts the barrier layer 240) is equal to P3 (which is the percentage of the upper surface of the portion of the barrier layer 240 that is between the gate contact 254 and the drain contact 252 where the first passivation layer 262 directly contacts the barrier layer 240), and P2 (which is the percentage of the upper surface of the portion of the barrier layer 240 that is between the source contact 250 and the gate contact 254 where the second passivation layer 264 directly contacts the barrier layer 240) is equal to P4 (which is the percentage of the upper surface of the portion of the barrier layer 240 that is between the gate contact 254 and the drain contact 252 where the second passivation layer 264 directly contacts the barrier layer 240). In other embodiments, P2 and P4 may differ by at least 10 percentage points, by at least 20 percentage points, by at least 30 percentage points, by at least 40 percentage points, or even by at least 50 percentage points. In some embodiments P4 may exceed P2 by at least 10 percentage points, by at least 20 percentage points, by at least 30 percentage points, by at least 40 percentage points, or even by at least 50 percentage points. Typically, if P4 exceeds P2, then P1 will exceed P3.

Figure 5A:
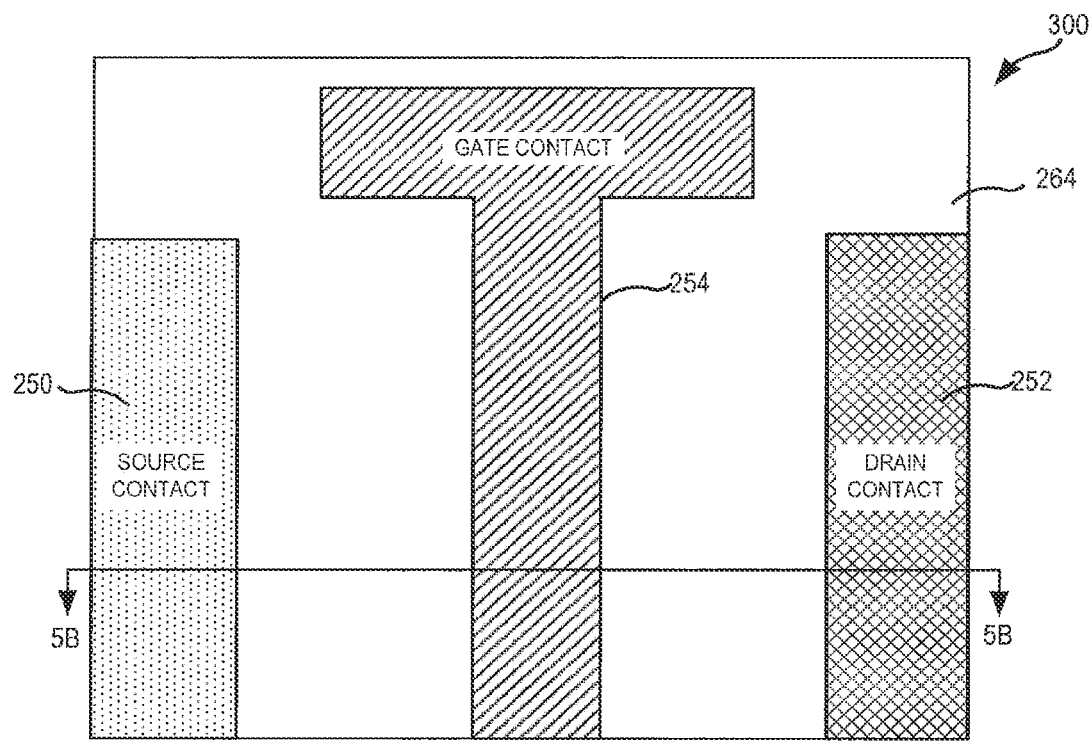
FIGS. 5A and 5B are a schematic plan view and a schematic cross-sectional view, respectively, of a high electron mobility transistor according to further embodiments of the present invention.
Figure 5B:
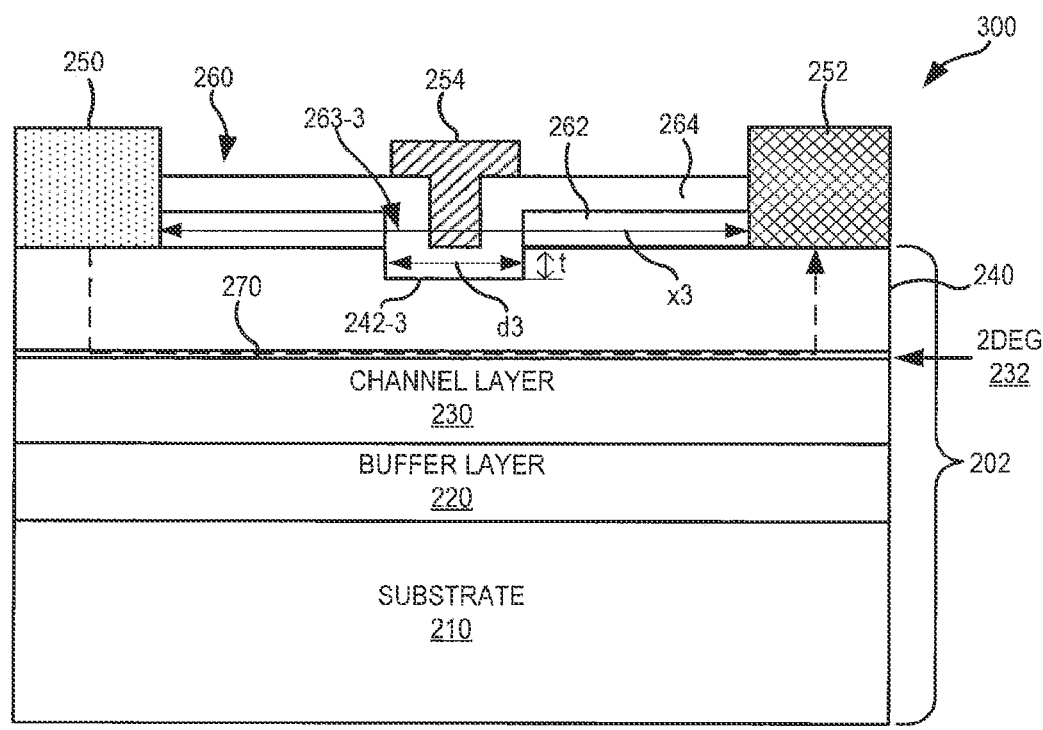

FIGS. 5A and 5B are a schematic plan view and cross-sectional view, respectively, of a HEMT device 300 according to further embodiments of the present invention. As shown in FIGS. 5A-5B, the HEMT 300 is similar to HEMT 200, except that the openings 263-1 and 263-2 (and the recesses 242-1, 242-2) are omitted in HEMT 300, and an opening 263-3 is instead provided in the first passivation layer 262 underneath the gate contact 254. The second passivation layer 264 may be formed in the opening 263-3. The second passivation layer 264 may directly contact the upper surface of the barrier layer 240.

As shown in FIG. 5B, an optional recess 242-3 may be formed in the barrier layer 240 underneath the opening 263-3. The optional recess 242-3 may have a depth t. The depth t of recess 242-3 may be in the same ranges discussed above for the depth t of recesses 242-1 and 242-2. The opening 263-3 may have a lateral width of d3, as shown in FIG. 5B. The width d3 may correspond to the width of the recess 242-3. In embodiments where the recess 242-3 is omitted (i.e., in embodiments where t=0), the lateral width of the opening 263-3 will still be considered to be d3 for the sake of consistency (i.e., the distance d3 corresponds to the separation between the portion of the first passivation layer 262 that is between the source contact 250 and the gate contact 254 and the portion of the first passivation layer 262 that is between the gate contact 254 and the drain contact 252). In the embodiment of FIGS. 5A-5B, the second passivation layer 264 directly contacts the upper surface of the barrier layer 240 within the opening 263-3.

The distance between the source contact 250 and the drain contact 252 may be a distance x3. Sample devices were fabricated having the design of HEMT 300 where the distance d3 was varied as a percentage of the distance x3 to determine the impact of the lateral width d3 on device performance. The drain current drift performance of these samples did not exhibit significant improvement. However, the gate leakage current $I_G$ and the drain leakage current $I_D$ did exhibit substantial improvement as compared to a conventional device. TABLE 2 shows the measured results.

TABLE 2

| Sample | Structure | Gate Leakage (mA/mm) | Drain Leakage (mA/mm) |
|---|---|---|---|
| N/A | Conventional Device | −364.0 | 382.0 |
| 5 | HEMT 300 with d3~0 | −282.5 | 266.5 |
| 6 | HEMT 300 with d3 = 0.2* × 3 | −12.0 | 13.0 |
| 7 | HEMT 300 with d3 = 0.4* × 3 | −7.0 | 9.0 |
| 8 | HEMT 300 with d3 = 0.6* × 3 | −6.0 | 7.0 |

As shown in TABLE 2, the use of a passivation layer formed from a charge dissipation material and the inclusion of the opening 263-3 act to improve both the gate leakage current and the drain leakage current performance. The wider the opening 263-3, the greater the improvement in performance.

Figure 6A:
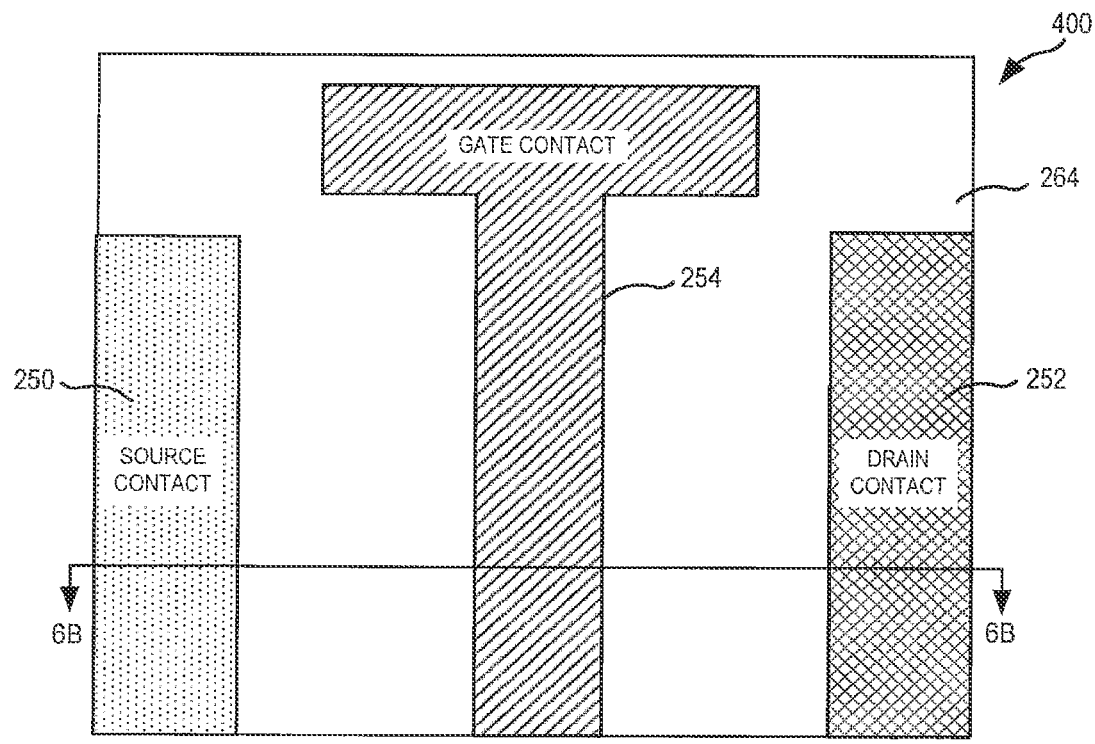
FIGS. 6A and 6B are a schematic plan view and a schematic cross-sectional view, respectively, of a high electron mobility transistor according to still further embodiments of the present invention.
Figure 6B:
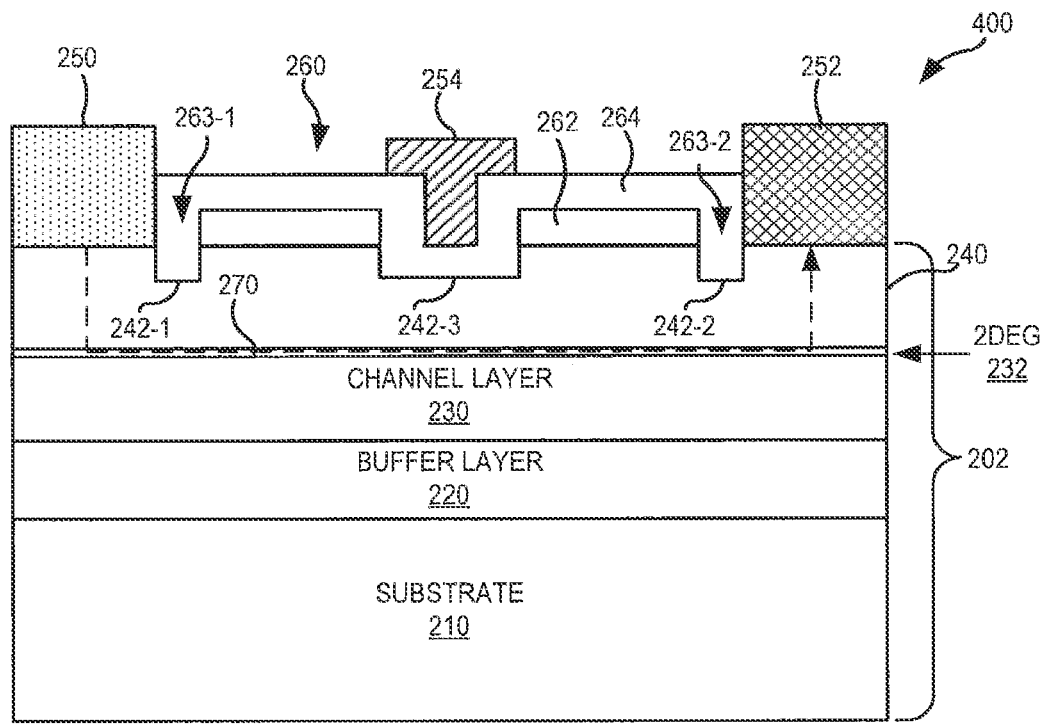

Pursuant to further embodiments of the present invention, features of HEMT 200 and HEMT 300 may be combined. In particular, as shown in FIGS. 6A and 6B, a HEMT 400 may be provided that includes all three openings 263-1, 263-2 and 263-3 in the first passivation layer 262, with the second passivation layer 264 filling these openings 263-1, 263-2 and 263-3. The HEMT 400 may optionally include one or more of the recesses 242-1, 242-2, 242-3 in the barrier layer 240, as shown in FIG. 6B. As discussed above with respect to FIGS. 3A-3B and TABLE 1, the inclusion of the openings 263-1 and 263-2 along with the use of a first passivation layer 262 that is formed of a charge dissipation material may significantly improve the drain current drift performance of the device. As discussed above with respect to FIGS. 5A-5B and TABLE 2, the inclusion of the opening 263-3 along with the use of a second passivation layer 264 that is formed of a non-charge dissipation material may significantly improve the gate leakage current and drain leakage current performance of the device. The HEMT device 400 of FIGS. 6A-6B includes all three openings 263-1 through 263-3 with the second passivation layer 264 formed therein. It is anticipated that the HEMT device 400 will exhibit improved drain current drift performance as well as improved gate and drain leakage current performance as compared to, for example, the conventional HEMT device of FIGS. 1A-1B.

Figure 7:
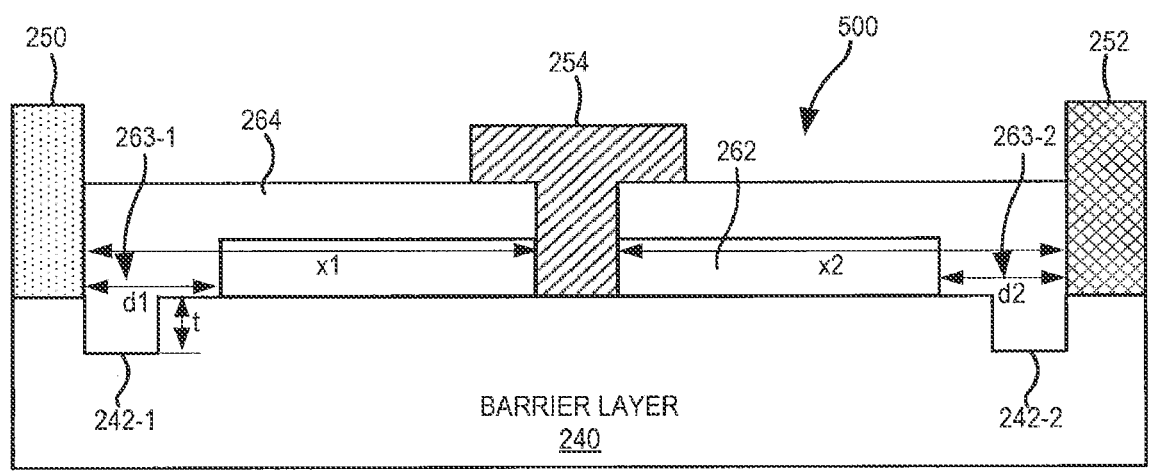
FIG. 7 is a schematic cross-sectional view of a high electron mobility transistor according to additional embodiments of the present invention.

FIG. 7 is an enlarged cross-sectional view of a portion of a HEMT 500 according to further embodiments of the present invention. The HEMT 500 may be identical to the HEMT 200 of FIGS. 3A-3C, except that, as shown in FIG. 7, in HEMT 500 the second passivation layer includes first portions 265 that fill the respective recesses 242-1 and 242-2, and a second portion 266 that is outside the recesses 242-1 and 242-2 but that still directly contacts the upper surface of the barrier layer 240. In other words, in the HEMT 500, the lateral widths d1 and d2 of the respective openings 263-1, 263-2 in the first passivation layer 262 are larger than the lateral widths of the recesses 242-1, 242-3. FIG. 7 is provided to illustrate that the second passivation layer 264 may contact the upper surface of the barrier layer 240 outside of the recesses 242-1, 242-2, 242-3.

Figure 8:
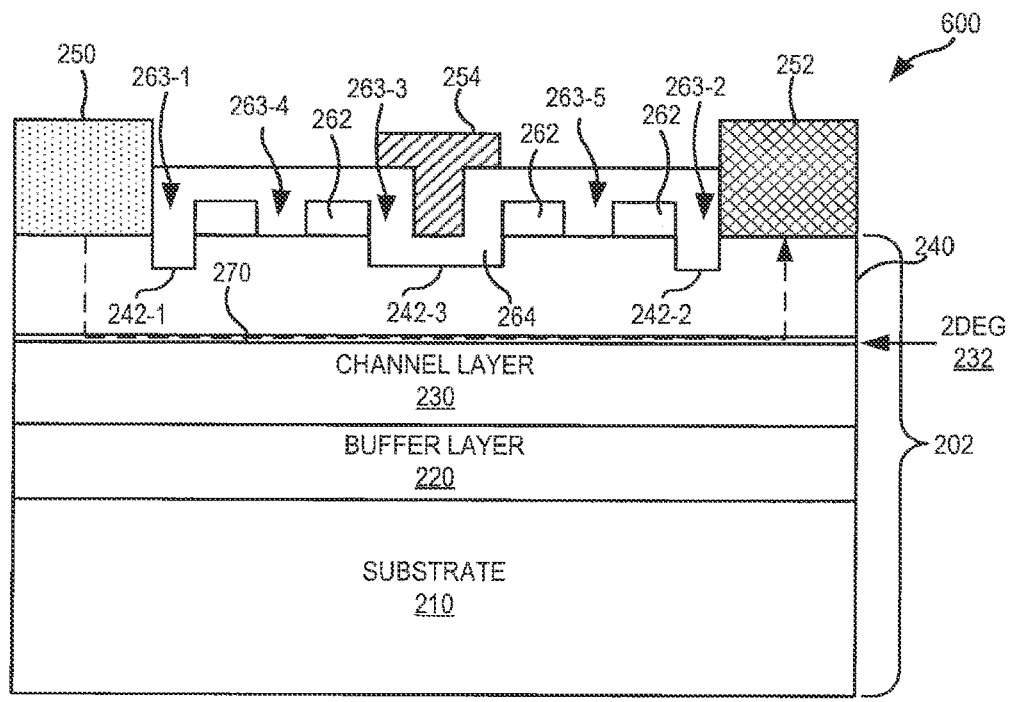
FIG. 8 is a schematic cross-sectional view of a high electron mobility transistor according to still further embodiments of the present invention.

FIG. 8 is a cross-sectional view of a HEMT device 600 according to another embodiment of the present invention. The HEMT 600 is similar to the HEMT 500 described above, but here additional openings 263-4, 263-5 are formed in the first passivation layer 262 and the the second passivation layer 264 is configured to directly contact the upper surface of the barrier layer 240 in all five of the openings 263-1 through 263-5.

FIGS. 9A-9F illustrate a method of forming the HEMT device 400 according to embodiments of the present invention. It will be appreciated that slightly modified techniques may be used to form the HEMT devices 200 and 300 described above.

Figure 9A:
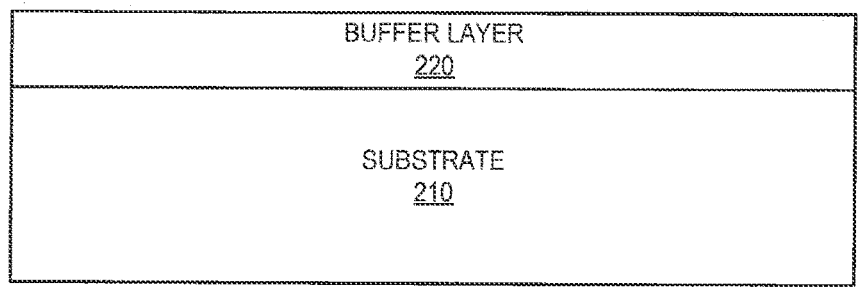
FIGS. 9A-9F are schematic cross-sectional diagrams illustrating a method of fabricating a high electron mobility transistor according to embodiments of the present invention.

As shown in FIG. 9A, one or more optional buffer layers, nucleation layers and/or transition layers 220 may be formed on substrate 210 such as, for example, a silicon carbide substrate. The buffer/nucleation/transition layers 220 may comprise, for example, Group III nitride layers such as aluminum nitride, gallium nitride and the like. The optional layers 220 may facilitate growth of high quality Group III nitride layers on the substrate 210 despite, for example, a lattice mismatch between the substrate 210 and the channel and barrier layers 230, 240 that are formed higher in the device structure. The optional buffer/nucleation/transition layers 220 may be formed by metal organic chemical vapor deposition (MOCVD) or by other techniques known to those of skill in the art, such as molecular beam epitaxy (MBE) or high vapor pressure epitaxy (HVPE).

Figure 9B:
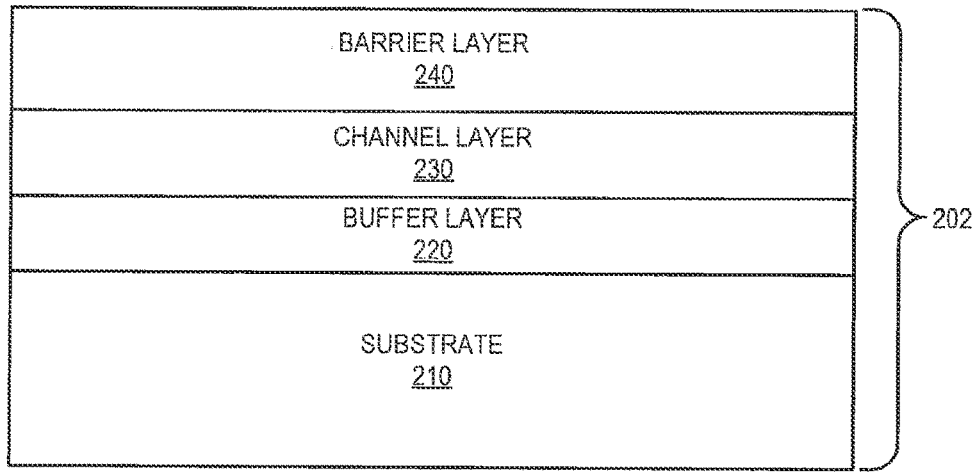

As shown in FIG. 9B, a channel layer 230 may be formed on an upper surface of the buffer layer(s) 220, and a barrier layer 240 may be formed on an upper surface of the channel layer 230. The channel layer 230 may have a bandgap that is less than the bandgap of the barrier layer 240 and the channel layer 230 may also have a larger electron affinity than the barrier layer 240. The channel layer 230 and the barrier layer 240 may include Group III-nitride based materials. For example, the channel layer 230 may comprise a gallium nitride layer, and the barrier layer 240 may comprise an $Al_xGa_{1-x}N$, where 0<x<1, The channel layer 230 may be undoped ("unintentionally doped") and may be grown to a thickness of greater than about 20 Å. The barrier layer 240 may be undoped or doped with an n-type dopant in example embodiments. The channel layer 230 and/or the barrier layer 240 may be deposited, for example, by MOCVD, MBE or HVPE.

Figure 9C:
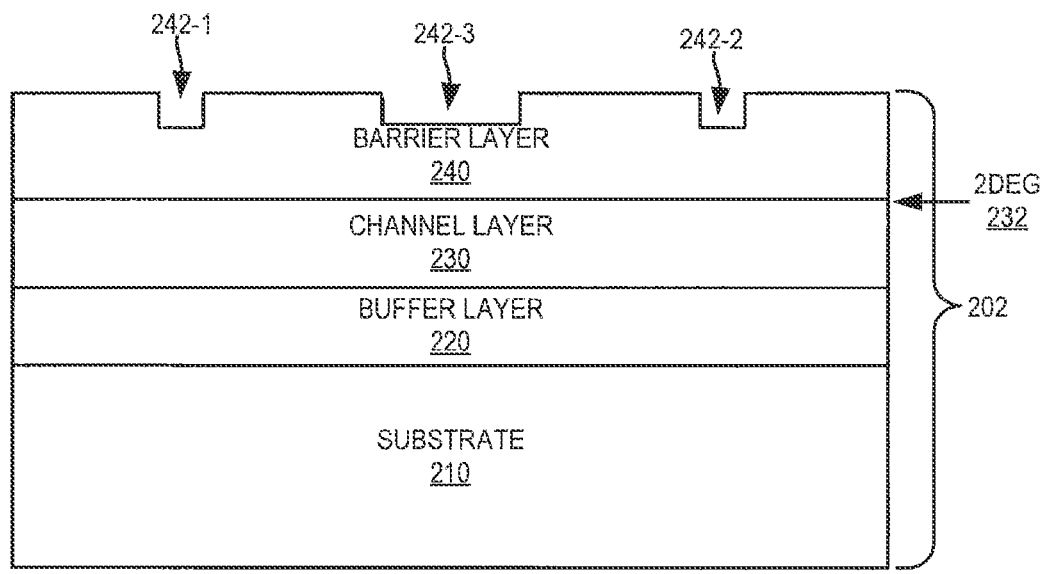

Referring to FIG. 9C, next the recesses 242-1 through 242-3 may be formed in the upper surface of the barrier layer 240. The recesses 242 may be formed, for example, by forming an etch mask (not shown) on the upper surface of the barrier layer 240 and then patterning the etch mask to form openings above the locations for the recesses 242, and then etching the exposed portions of the barrier layer 240 to form the recesses 242.

Figure 9D:
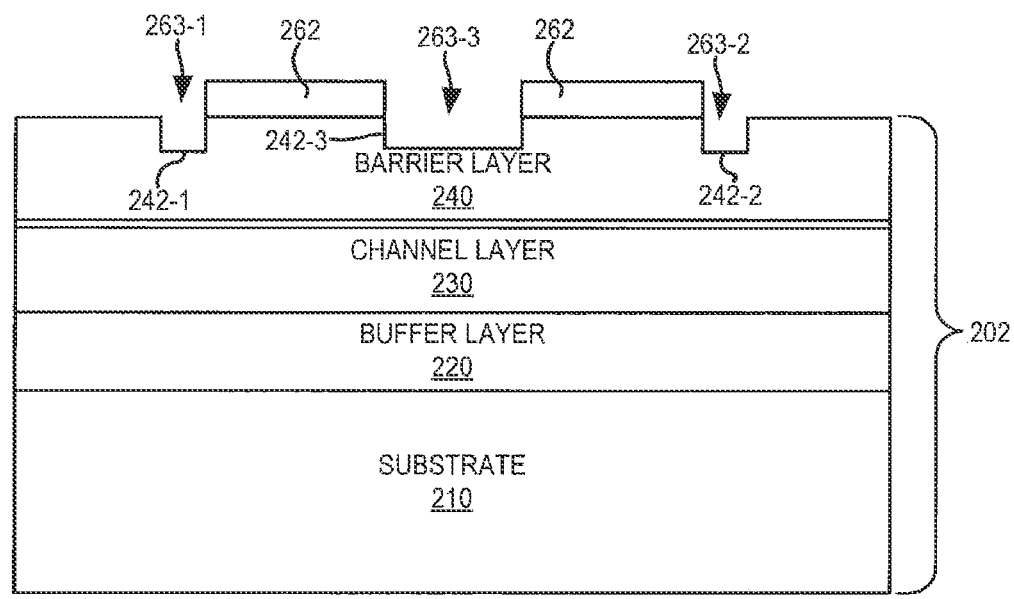

Referring to FIG. 9D, a first passivation layer 262 that comprises a charge dissipation material such as, for example, silicon-rich silicon nitride or alumina may next be formed. The first passivation layer 262 may be blanket deposited on the device by, for example, sputtering or physical vapor deposition. An etch mask (not shown) may then be formed on the first passivation layer 262, and this etch mask may be patterned using standard photolithography techniques. The blanket deposited first passivation layer 262 may then be patterned using the patterned etch mask to form one or more openings 263-1 through 263-3 therein, as shown in FIG. 9D.

Figure 9E:
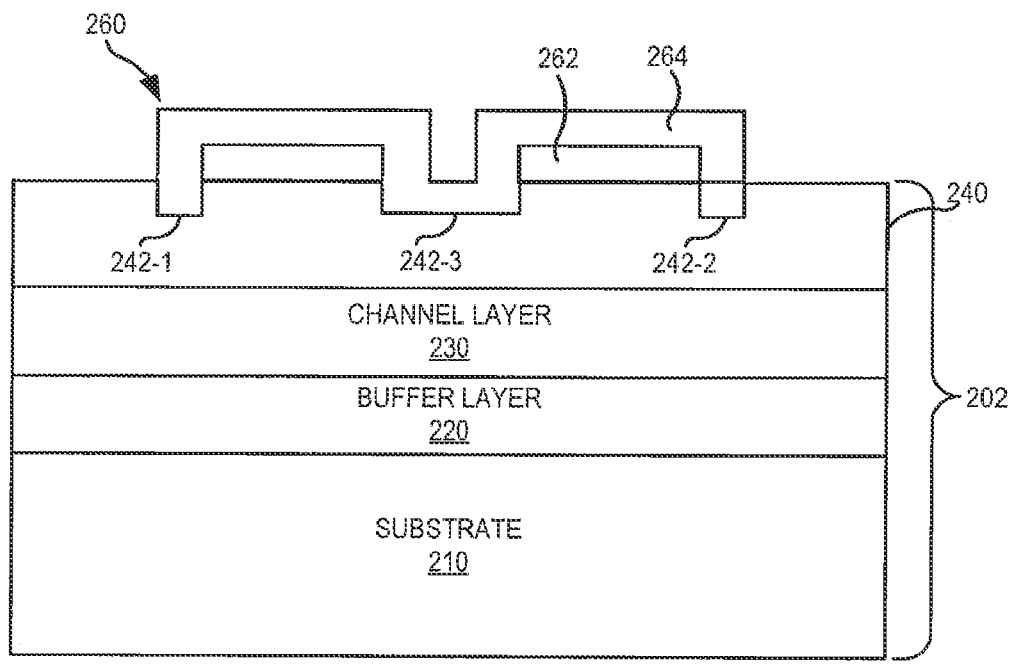

Referring to FIG. 9E, a second passivation layer 264 may be blanket deposited on the device by, for example, sputtering or physical vapor deposition. The second passivation layer 264 may comprise a conventional passivation material such as, for example, stoichiometric silicon nitride. The second passivation layer 264 may not include a charge dissipation material. An etch mask (not shown) may then be formed on the second passivation layer 264, and this etch mask may be patterned using standard photolithography techniques. The blanket deposited second passivation layer 264 may then be patterned using the patterned etch mask, as shown in FIG. 9E. The second passivation layer 264 may fill the openings 263-1 through 263-3, and may also fill the optional recesses 242-1 through 242-3, if provided. The second passivation layer 264 may also cover the upper surface of the first passivation layer 262. Together the first and second passivation layers 262, 264 may form a stacked multi-layer passivation structure 260.

Figure 9F:
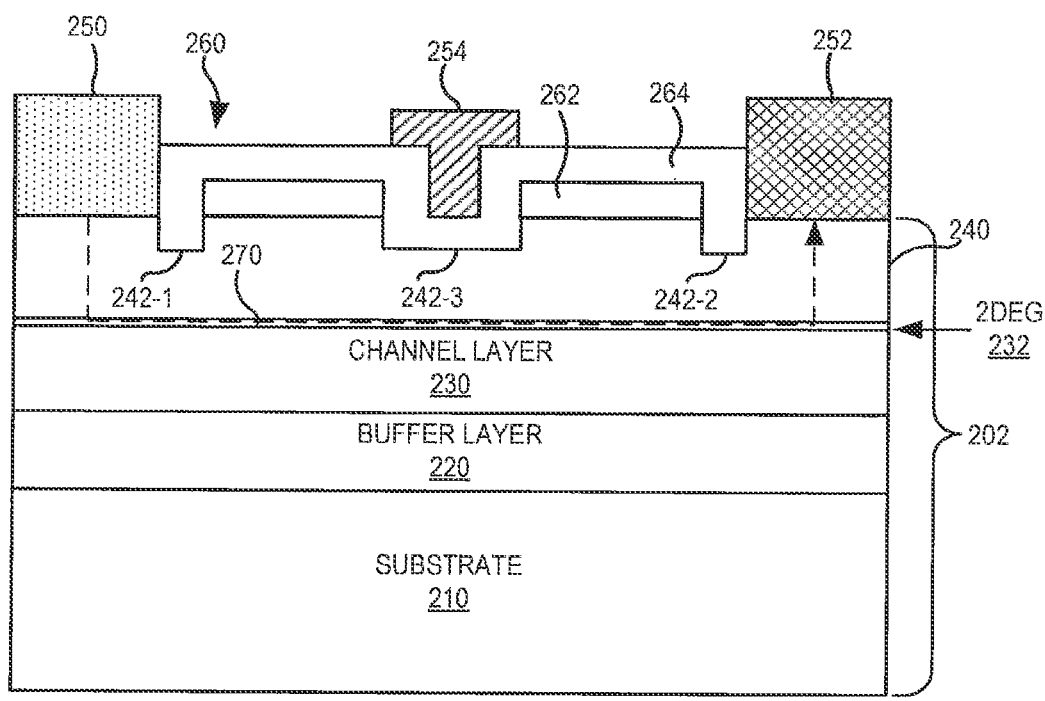

Next, as shown in FIG. 9F, metal contacts may be formed on the upper surface of the barrier layer 240. In particular, a source contact 250 and a drain contact 252 may be formed together in a single step. The source contact 250 and the drain contact 252 may include a metal, such as TiAlN, that can form an ohmic contact to a gallium nitride based semiconductor material. The ohmic metal may be blanket deposited on the device by, for example, sputtering, and then appropriate masking and etching steps may be performed to form the source contact 250 and the drain contact 252. A gate contact 254 may be formed in a similar manner on the upper surface of the barrier layer 240. The material used to form the gate contact 254 may be a material capable of making a Schottky contact to a gallium nitride based semiconductor material, such as, for example, Ni, Pt, NiSi$_x$, Cu, Pd, Cr, W and/or WSiN. The gate contact 254 may be formed either before or after the source contact 250 and the drain contact 252.

Thus, pursuant to some embodiments of the present invention, HEMT devices are provided that include recesses in the upper surface of the barrier layer between the source contact and the drain contact. A passivation structure is formed on the semiconductor structure of the device and within the one or more recesses. In some embodiments, the passivation structure may be a multi-layer passivation structure that includes a first passivation layer that may be formed, for example, of a charge dissipation material, and a second passivation layer that may be formed of a non-charge dissipation material in order to block gate and/or drain leakage currents. Both the first passivation layer and the second passivation layer may directly contact the barrier layer, and the second passivation layer may also cover some or all of the first passivation layer. In some embodiments, the one or more recesses in the upper surface of the barrier layer may include a recess that is adjacent the source contact and/or a recess that adjacent the drain contact. The device may additionally or alternatively include an opening in the upper surface of the barrier layer that is underneath the gate contact.

In other embodiments, HEMT devices are provided that include a first passivation layer that directly contacts an upper surface of the barrier layer. The first passivation layer may directly contact a first percentage of the upper surface of the portion of the barrier layer that is between the source contact and the gate contact and may directly contact a second percentage of the upper surface of the portion of the barrier layer that is between the gate contact and the drain contact, where the second percentage is different from the first percentage. For example, in some embodiments the second percentage may exceed the first percentage by at least 10 percentage points, at least 20 percentage points, at least 30 percentage points, at least 40 percentage points or at least 50 percentage points. A second passivation layer may be formed on the first passivation layer. The second passivation layer may also directly contact portions of the upper surface of the barrier layer between the source contact and the drain contact that are not covered by the first passivation layer. The second passivation layer may comprise a different material than the first passivation layer. For example, the first passivation layer may be a charge dissipation material and the second passivation layer may be a conventional passivation material that does not include charge dissipation qualities.

According to still further embodiments of the present invention, high electron mobility transistors are provided that include a multi-layer passivation structure that has a first passivation layer that is formed of a charge dissipation material that directly contacts an upper surface of the barrier layer between the source contact and the drain contact and a second passivation layer that also directly contacts the upper surface of the barrier layer between the source contact and the drain contact, the second passivation layer comprising a different material than the first passivation layer. The second passivation layer may also be formed on an upper surface of the first passivation layer, and may be formed of a non-charge dissipation material.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A high electron mobility transistor, comprising:
   a channel layer;
   a barrier layer on the channel layer, the barrier layer having a lower surface that is adjacent the channel layer and an upper surface that is opposite the lower surface;
   a source contact on the upper surface of the barrier layer;
   a drain contact on the upper surface of the barrier layer;
   a gate contact on the upper surface of the barrier layer between the source contact and the drain contact; and
   a passivation layer on the upper surface of the barrier layer between the source contact and the drain contact,
   wherein the passivation layer is within a first recess that is provided in the upper surface of the barrier layer adjacent a sidewall of one of the source contact and the drain contact that faces the gate contact, the first recess extending further into the barrier layer than at least one of the source contact and the drain contact,
   wherein a longitudinal axis of the first recess extends in parallel to a longitudinal axis of the drain contact.

2. The high electron mobility transistor of claim 1, wherein the passivation layer comprises a second passivation layer, the high electron mobility transistor further comprising a first passivation layer on the upper surface of the barrier layer between the source contact and the drain contact, wherein both the first passivation layer and the second passivation layer directly contact the barrier layer, and wherein the first passivation layer comprises a first material and the second passivation layer comprises a second material that is different than the first material.

3. The high electron mobility transistor of claim 2, wherein the first material is a first silicon nitride material having a first ratio of silicon to nitrogen and the second material is a second silicon nitride material having a second ratio of silicon to nitrogen, wherein the first ratio of silicon to nitrogen is at least ten percentage points greater than the second ratio of silicon to nitrogen.

4. The high electron mobility transistor of claim 1, wherein the passivation layer comprises a second passivation layer, the high electron mobility transistor further comprising a first passivation layer on the upper surface of the barrier layer between the source contact and the drain contact, wherein the first passivation layer comprises a first material that is a charge dissipation material and the second passivation layer comprises a second material that is different than the first material.

5. The high electron mobility transistor of claim 4, wherein the second passivation layer is not a charge dissipation material.

6. The high electron mobility transistor of claim 5, wherein the charge dissipation material is silicon-rich silicon nitride or alumina.

7. The high electron mobility transistor of claim 1, wherein the first recess only extends partially through the barrier layer.

8. The high electron mobility transistor of claim 1, wherein the first recess is adjacent the drain contact and the barrier layer, the high electron mobility transistor further comprising a second recess in the upper surface of the barrier layer adjacent the source contact, the second recess only extending partially through the barrier layer, the passivation layer also being within the second recess.

9. The high electron mobility transistor of claim 8, further comprising a third recess in the upper surface of the barrier layer, wherein the second passivation layer is within the third recess, wherein the third recess is underneath the gate contact.

10. A high electron mobility transistor, comprising:
    a channel layer;
    a barrier layer on the channel layer, the barrier layer having a lower surface that is adjacent the channel layer and an upper surface that is opposite the lower surface;
    a source contact on the upper surface of the barrier layer;
    a drain contact on the upper surface of the barrier layer;
    a gate contact on the upper surface of the barrier layer between the source contact and the drain contact; and
    a passivation layer on the upper surface of the barrier layer between the source contact and the drain contact,
    wherein the passivation layer is within a first recess in the upper surface of the barrier layer that only extends partially through the barrier layer, the first recess being adjacent one of the source contact and the drain contact.

11. The high electron mobility transistor of claim 10, wherein the first recess is adjacent the drain contact and the barrier layer, the high electron mobility transistor further comprising a second recess in the upper surface of the barrier layer adjacent the source contact, the second recess only extending partially through the barrier layer, the passivation layer also being within the second recess.

12. The high electron mobility transistor of claim 11, further comprising a third recess in the upper surface of the barrier layer, wherein the second passivation layer is within the third recess, wherein the third recess is underneath the gate contact.

13. The high electron mobility transistor of claim 10, wherein the passivation layer comprises a second passivation layer, the high electron mobility transistor further comprising a first passivation layer on the upper surface of the barrier layer between the source contact and the drain contact, wherein both the first passivation layer and the second passivation layer directly contact the barrier layer, and wherein the first passivation layer comprises a first material that is a charge dissipation material and the second passivation layer comprises a second material that is different than the first material.

14. A high electron mobility transistor, comprising:
a channel layer;
a barrier layer on the channel layer, the barrier layer having a lower surface that is adjacent the channel layer and an upper surface that is opposite the lower surface;
a source contact on the upper surface of the barrier layer;
a drain contact on the upper surface of the barrier layer;
a gate contact on the upper surface of the barrier layer between the source contact and the drain contact; and
a passivation layer on the upper surface of the barrier layer between the source contact and the drain contact,
wherein the passivation layer is within a first recess in the barrier layer,
wherein a sidewall of the first recess is aligned with a sidewall of one of the source contact and the drain contact, and
wherein a bottom of the first recess is closer to the channel layer than is a bottom surface of at least one of the source contact and the drain contact.

15. The high electron mobility transistor of claim 14, wherein the passivation layer comprises a second passivation layer, the high electron mobility transistor further comprising a first passivation layer on the upper surface of the barrier layer between the source contact and the drain contact, wherein both the first passivation layer and the second passivation layer directly contact the barrier layer, and wherein the first passivation layer comprises a first material and the second passivation layer comprises a second material that is different than the first material.

16. The high electron mobility transistor of claim 15, wherein a portion of the first passivation layer that directly contacts the upper surface of the barrier layer is positioned between the gate contact and a portion of the second passivation layer that directly contacts the upper surface of the barrier layer.

17. The high electron mobility transistor of claim 15, wherein the first material is silicon-rich silicon nitride or alumina.

18. The high electron mobility transistor of claim 14, wherein the first recess only extends partially through the barrier layer.

19. The high electron mobility transistor of claim 14, wherein the first recess is adjacent the drain contact and the barrier layer further comprises a second recess that only extends partially through the barrier layer adjacent the source contact, the passivation layer also being within the second recess.

20. The high electron mobility transistor of claim 19, further comprising a third recess in the upper surface of the barrier layer, wherein the passivation layer is within the third recess, wherein the third recess is underneath the gate contact.

* * * * *

UNITED STATES PATENT AND TRADEMARK OFFICE
CERTIFICATE OF CORRECTION

| | |
|---|---|
| PATENT NO. | : 11,355,600 B2 |
| APPLICATION NO. | : 17/148688 |
| DATED | : June 7, 2022 |
| INVENTOR(S) | : Lee et al. |

It is certified that error appears in the above-identified patent and that said Letters Patent is hereby corrected as shown below:

On the Title Page

(71) Applicant: Please correct "Cree, Inc." to read --Wolfspeed, Inc.--

In the Claims

Column 20, Line 35, Claim 9: Please correct "the second passivation" to read --the passivation--

Column 20, Line 62, Claim 12: Please correct "the second passivation" to read --the passivation--

Signed and Sealed this
Twenty-fifth Day of October, 2022

Katherine Kelly Vidal
*Director of the United States Patent and Trademark Office*